US012718895B2

(12) United States Patent
Zhou et al.

(10) Patent No.: US 12,718,895 B2
(45) **Date of Patent: *Aug. 25, 2026**

(54) READ DISTURB MANAGEMENT

(71) Applicant: Micron Technology, Inc., Boise, ID (US)

(72) Inventors: Zhenming Zhou, San Jose, CA (US); Murong Lang, San Jose, CA (US); Li-Te Chang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 141 days.

This patent is subject to a terminal disclaimer.

(21) Appl. No.: 18/787,787

(22) Filed: Jul. 29, 2024

(65) Prior Publication Data

US 2024/0386972 A1 Nov. 21, 2024

Related U.S. Application Data

(63) Continuation of application No. 17/871,689, filed on Jul. 22, 2022, now Pat. No. 12,051,471.

(51) Int. Cl.
*G11C 16/34* (2006.01)
*G11C 11/406* (2006.01)

(52) U.S. Cl.
CPC .... *G11C 16/3418* (2013.01); *G11C 11/40618* (2013.01); *G11C 16/349* (2013.01)

(58) Field of Classification Search
CPC .......... G11C 16/3418; G11C 11/40618; G11C 16/349
See application file for complete search history.

(56) References Cited

U.S. PATENT DOCUMENTS 7,818,525 B1 10/2010 Frost et al.
8,189,379 B2 5/2012 Camp et al.
8,943,263 B2 1/2015 Frost et al.
9,037,777 B2 5/2015 Sabbag
2007/0133295 A1 6/2007 Fong et al.
2009/0323412 A1 12/2009 Mokhlesi et al.
2015/0039842 A1* 2/2015 Fitzpatrick .......... G11C 11/5642 711/154
2020/0159424 A1* 5/2020 Shah .................. G06F 12/0207
2023/0207037 A1 6/2023 Lu

* cited by examiner

*Primary Examiner* — Han Yang
(74) *Attorney, Agent, or Firm* — Brooks, Cameron & Huebsch, PLLC

(57) ABSTRACT

An example system can include a memory device and a processing device. The memory device can include a group of memory cells. The processing device can be coupled to the memory device. The processing device can be configured to determine a distance of a memory die from a center of a memory component. The processing device can be configured to perform a read disturb operation on the memory die based on the determined distance use a first voltage window for a set of memory cells of the group of memory cells during a first time period.

20 Claims, 5 Drawing Sheets

READ DISTURB MANAGEMENT

PRIORITY INFORMATION

This Application is a Continuation of U.S. application Ser. No. 17/871,689, filed on Jul. 22, 2022, which issues as U.S. Pat. No. 12,051,471 on Jul. 30, 2024, the contents of which are incorporated herein by reference.

TECHNICAL FIELD

Embodiments of the disclosure relate generally to memory sub-systems, and more specifically, relate to read disturb management.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
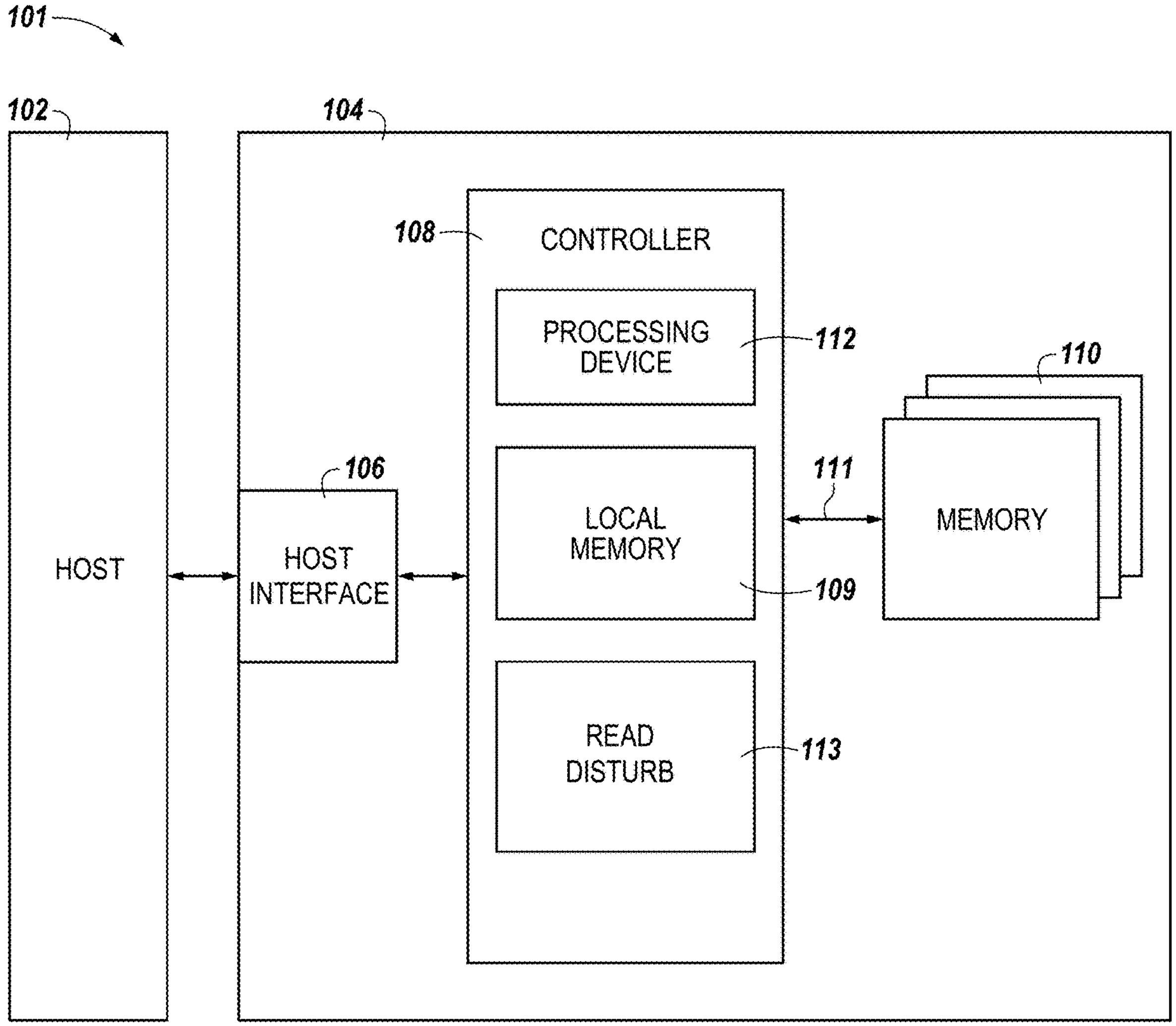
FIG. 1 illustrates an example computing environment that includes a memory sub-system in accordance with some embodiments of the present disclosure.

Aspects of the present disclosure are directed to read disturb management within a memory sub-system. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

During the sensing of a memory cell, a voltage may be applied to the memory cell, and the data state of the cell can be determined based on the amount of current that flows through the cell in response to the applied voltage. During such a sense operation, however, other (e.g., unselected) memory cells that are coupled to the same signal line as the memory cell that is being sensed may be undesirably affected by the voltage being applied to the selected memory cell being sensed. This undesirable effect on the unselected memory cells can be referred to as read disturb. These unselected memory cells can be referred to as victim memory cells (or victim word lines, in the case of word lines being affected).

A memory cell that has been significantly affected by read disturb may be sensed to be in a different data state than the state to which the cell was actually programmed, because, for instance, the read disturb may have caused the threshold voltage of the memory cell to decrease. Such erroneous data sensing due to the read disturb can reduce the performance and/or lifetime of the memory and may be more severe in memory having an increased memory cell density. Therefore, it may be beneficial to refresh those affected cells prior to the read disturb on memory cells causing erroneous sensing of the cells. Further, as there are many memory dies on a single memory wafer, memory dies that are closer to the outer edge of the memory wafer (e.g., further from the center of the wafer), can experience increased read disturb affects due to nonuniform process conditions on the edge of the memory wafer.

In some examples, within NAND flash memory, read disturb errors can occur for two reasons. One is a biasing condition that happens during read operations. The cells in NAND memory can be strung together in a line that is similar to a multi-input NAND gate. When a read operation is initiated, the appropriate word line is biased to the read threshold voltage. The word lines not involved in the read operation are biased to high voltage simultaneously. This allows the selected cells' state to move to the sense amplifier by creating a fully conducting NAND string. A side effect of biasing is the programming of the unselected word lines. As that same read cycle is performed repeatedly, the programming of the word lines will increase, ultimately triggering a sensing error. Another common cause of read disturb errors is cross-coupling noise. Cross-coupling noise occurs in nearby cells, and it gets worse as usage of the memory device increases. Errors caused by cross-coupling noise also increase in high temperatures. As temperatures increase, leakage of charge to and from memory cells can also increase.

In some previous approaches, a number of fixed (e.g., unchanging) read disturb handling parameters, such as a word line (WL) read disturb threshold (L), a refresh parameter (a), and a refresh threshold (T) may be used. However, as the memory dies have different characteristics based on their distance from the center of the memory wafer, a worse die closer to the edge (e.g., a die that was manufactured farther from the center of the wafer) may need to be refreshed more than a memory die that was manufactured closer to the center. In order to avoid any memory die from operating incorrectly, all of the memory dies, regardless of location and/or distance from the center of the memory wafer, may be refreshed at the same rate. However, such approaches may refresh some memory dies more frequently than needed and expend unnecessary resources and power in the memory system.

Embodiments of the present disclosure, however, can adjust a window size value based on the location and/or distance of a memory die with respect to the center of the memory wafer. In this way, a refresh operation to correct read disturb can occur at varying frequencies and varying sizes of portions of data can be used based on the location and/or distance, thereby avoiding expending resources where unnecessary to maintain a threshold level of data accuracy.

As used herein, "a", "an", or "a number of" can refer to one or more of something, and "a plurality of" can refer to two or more such things. For example, a memory device can refer to one or more memory devices, and a plurality of memory devices can refer to two or more memory devices. Further, the figures herein follow a numbering convention in which the first digit or digits correspond to the drawing figure number and the remaining digits identify an element or component in the drawing. Similar elements or components between different figures may be identified by the use of similar digits.

FIG. 1 illustrates an example computing environment 101 that includes a memory sub-system 104 in accordance with some embodiments of the present disclosure. The memory sub-system 104 can include media, such as memory components 110. The memory components 110 can be volatile memory components, non-volatile memory components, or a combination of such. In some embodiments, the memory sub-system is a storage system. An example of a storage system is a SSD. In some embodiments, the memory sub-system 104 is a hybrid memory/storage sub-system. In general, the computing environment 100 can include a host system 102 that uses the memory sub-system 104. For example, the host system 102 can write data to the memory sub-system 104 and read data from the memory sub-system 104.

The host system 102 can be a computing device such as a personal laptop computer, a desktop computer, a digital camera, a mobile telephone, or a memory card reader, among various other types of hosts. The host system 102 can include or be coupled to the memory sub-system 104 (e.g., via a host interface 106) so that the host system 120 can read data from or write data to the memory subsystem 104. As used herein, "coupled to" generally refers to a connection between components, which can be an indirect communicative connection or direct communicative connection (e.g., without intervening components), whether wired or wireless, including connections such as electrical, optical, magnetic, etc. The host interface 106 can be a physical interface, examples of which include, but are not limited to, a serial advanced technology attachment (SATA) interface, a peripheral component interconnect express (PCIe) interface, universal serial bus (USB) interface, Fibre Channel, Serial Attached SCSI (SAS), etc. The host interface 106 can be used to transmit data between the host system 120 and the memory sub-system 104. The host system 102 can further utilize an NVM Express (NVMe) interface to access the memory components 110 when the memory sub-system 104 is coupled with the host system 102 by a PCIe interface. The physical host interface can provide an interface for passing control, address, data, and other signals between the memory sub-system 104 and the host system 102. The memory components 110 can include a number of arrays of memory cells (e.g., non-volatile memory cells). The arrays can be flash arrays with a NAND architecture, for example. However, embodiments are not limited to a particular type of memory array or array architecture. Although floating-gate type flash memory cells in a NAND architecture are generally referred to herein, embodiments are not so limited. The memory cells can be grouped, for instance, into a number of blocks including a number of physical pages. A number of blocks can be included in a plane of memory cells and an array can include a number of planes. As one example, a memory device can be configured to store 8 KB (kilobytes) of user data per page, 128 pages of user data per block, 2048 blocks per plane, and 16 planes per device. The memory components 110 can also include additionally circuitry (not illustrated), such as control circuitry, buffers, address circuitry, etc.

In operation, data can be written to and/or read from memory (e.g., memory components 110 of system 104) as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

The memory components 110 can include various combinations of the different types of non-volatile memory components and/or volatile memory components. An example of non-volatile memory components includes a negative-and (NAND) type flash memory. The memory components 110 can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 102. Although non-volatile memory components such as NAND type flash memory are described, the memory components 110 can be based on various other types of memory such as a volatile memory. In some embodiments, the memory components 110 can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 110 can be grouped as memory pages or data blocks that can refer to a unit of the memory component used to store data.

As illustrated in FIG. 1, the memory sub-system 104 can include a controller 108 coupled to the host interface 106 and to the memory components 110 via a memory interface 111. The controller 108 can be used to send data between the memory sub-system 104 and the host 102. The memory interface 111 can be one of various interface types compliant with a particular standard such as Open NAND Flash interface (ONFi).

The controller 108 can communicate with the memory components 110 to perform operations such as reading data, writing data, or erasing data at the memory components 110 and other such operations. The controller 108 can include hardware such as one or more integrated circuits and/or discrete components, a buffer memory, or a combination thereof. The controller 108 can be a microcontroller, special purpose logic circuitry (e.g., a field-programmable gate array (FPGA), an application-specific integrated circuit (ASIC), etc.), or other suitable processor. The controller 108 can include a processing device 112 (e.g., processor) configured to execute instructions stored in local memory 109. In the illustrated example, the local memory 109 of the controller 108 includes an embedded memory configured to store instructions for performing various processes, operations, logic flows, and routines that control operation of the memory sub-system 104, including handling communications between the memory sub-system 104 and the host system 102. In some embodiments, the local memory 109 can include memory registers storing memory pointers, fetched data, etc. The local memory 109 can also include read-only memory (ROM) for storing micro-code.

While the example memory sub-system 104 in FIG. 1 has been illustrated as including the controller 108, in another embodiment of the present disclosure, a memory sub-system 104 may not include a controller 108, and can instead rely upon external control (e.g., provided by an external host, such as by a processing device separate from the memory sub-system 104).

The controller 108 can use and/or store various operating parameters associated with operating (e.g., programming and/or reading) the memory cells. Such operating parameters may be referred to as trim values and can include programming pulse magnitude, step size, pulse duration, program verify voltages, read voltages, etc. for various different operating processes. The different processes can include processes to program cells to store different quantities of bits, and different multiple pass programming process types (e.g., 2-pass, 3-pass, etc.). The controller 108 can be responsible for other operations such as wear leveling operations, garbage collection operations, error detection and/or correction (e.g., error-correcting code (ECC)) operations, encryption operations, caching operations, and address translations between a logical block address and a physical block address that are associated with the memory components 110.

The memory sub-system 104 can also include additional circuitry or components that are not illustrated. For instance, the memory components 110 can include control circuitry, address circuitry (e.g., row and column decode circuitry), and/or input/output (I/O) circuitry by which they can communicate with controller 108 and/or host 102. As an example, in some embodiments, the address circuitry can receive an address from the controller 108 and decode the address to access the memory components 110.

In various embodiments, the controller 108 can include a read disturb component 113 to monitor and/or correct read disturb affects and refresh the associated memory cells accordingly. Further, the memory cells can be programmed, for example, via an incremental step pulse programming (ISPP) process in which a series of pulses of increasing magnitude are applied to the cells (to their gates) to increase the stored charge by a particular amount until the target stored threshold voltage (Vt) is reached. To program the cells, a program step characteristic can be used and can include, for example, various characteristics of voltage pulses used to program memory cells of the memory components 110. The characteristic can be, for example, a step size (e.g., voltage difference) between programming voltage pulses (e.g., between consecutive pulses). In another example, the characteristic can be a duration for which programming voltage pulse(s) are applied to memory cells.

Figure 2:
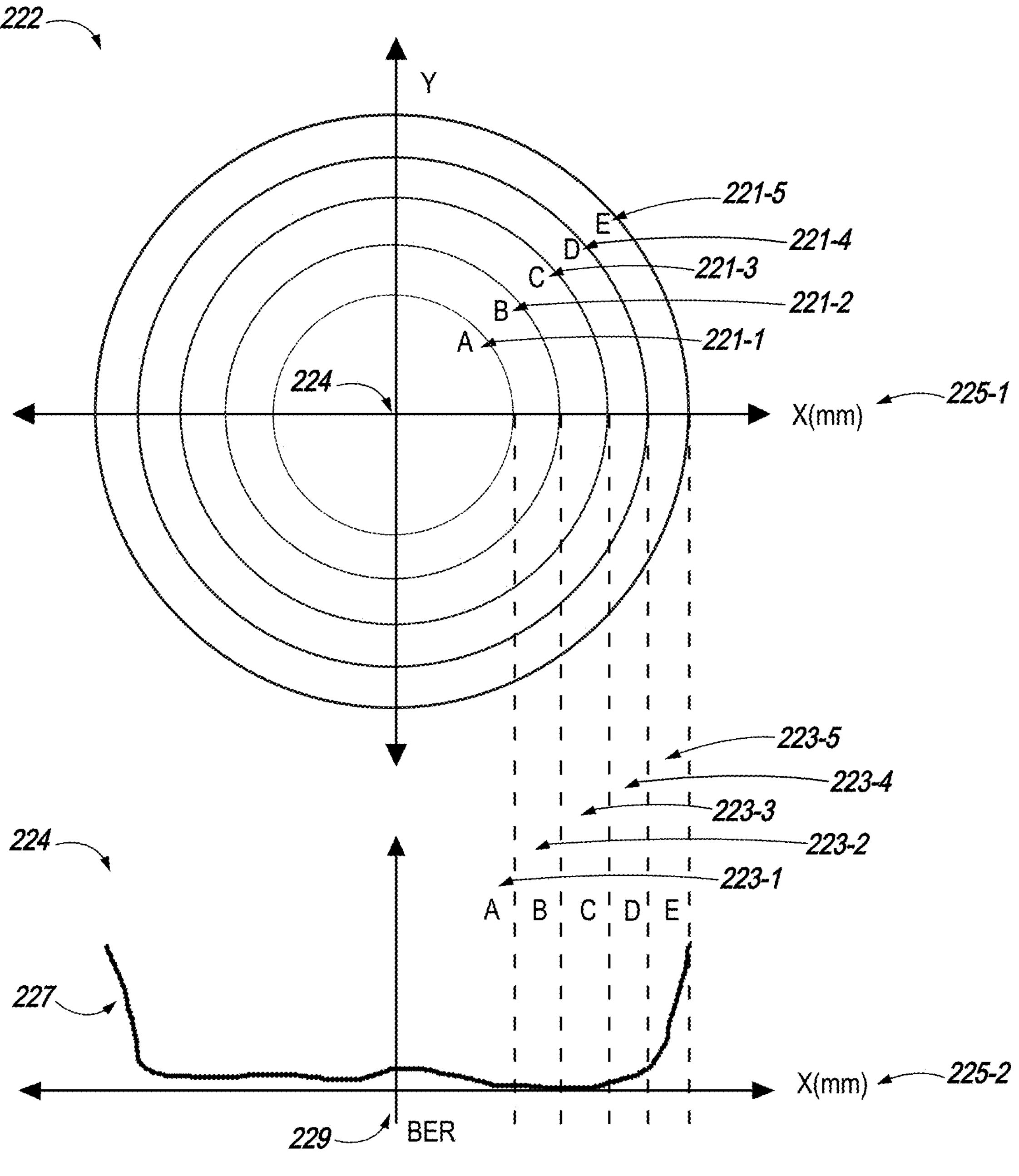
FIG. 2 illustrates an example of memory die locations and associated bit error rates (BERs) in accordance with some embodiments of the present disclosure.

FIG. 2 illustrates an example of memory die locations 222 and associated bit error rates (BERs) 224 in accordance with some embodiments of the present disclosure. The memory die locations 222 are illustrated as a center 224 of a wafer and regions labeled as region A 221-1, region B 221-2, region C 221-3, region D 221-4, and region E 221-5 that each designate a specific distance out from the center 224 (hereinafter referred to collectively as regions 221). The distances are indicated by the x-axis 224-1 that is measured in millimeters (mm). The increasing distance a region is from the center 224 can result in an increasing number of errors of the data stored in memory cells in a memory die at that location of the wafer. For example, regions A 221-1 to C 221-3 may have the least amount of errors in data stored. Region E 221-5 may have more errors than regions A 221-1 to C 221-3. As is illustrated in the bottom portion 224 of FIG. 2, the bit error rate (BER) at each of the regions 221 increases at each of the edges of the wafer.

In order to address this, as is described herein, a modification to the read disturb management can occur based on a location of the memory cells within the memory dies in relation to the overall wafer. As an example, the further the region 221 of memory cells is from the center 224 of the wafer, the smaller the window size for read disturb handling and the greater the frequency for scanning for errors. Likewise, the closer to the center of the 224, the greater the window size for read disturb handling and the smaller the frequency for scanning for errors.

In some examples, a read disturb operation can include using a particular window size of data. As an example, a number of read operations can consist of a stream of a particular size of data (e.g., 4 kilobytes, in some examples) that are directed to several memory dies in parallel, and the stream can include a series of non-overlapping windows of data whose size is equal to W counts of read operations. A number of parameters can be used in order to determine how to monitor the read disturbs during read disturb management. These parameters can include the window size already mentioned, a word line read disturb limit (L), a refresh parameter ($\alpha$, which can range from $0 \leq \alpha \leq 1$), and a refresh threshold (T) given as the product of $\alpha$ and L ($T = \alpha \times L$). An i-th read operation can be selected from the read operations within a particular window size. The raw bit error rate (RBER) of neighboring word lines (e.g., victim WLs) of the selected read operation. If the RBER is more than a refresh threshold (T), the block including the selected word line can be refreshed (e.g., a refresh operation can be performed on that block of data). Otherwise, if the RBER is less than the threshold, the block of data may not be refreshed. Subsequently, a next read operation in the next window size of the overall data can be chosen and a read operation selected within that next window size of data. In this way, the larger the window size, the lower the frequency of checking the data within that larger window size and the smaller the window size, the greater the frequency of checking the data within that smaller window size. If more errors are expected or likely, a greater frequency and smaller window size helps to identify those errors more quickly.

Figure 3:
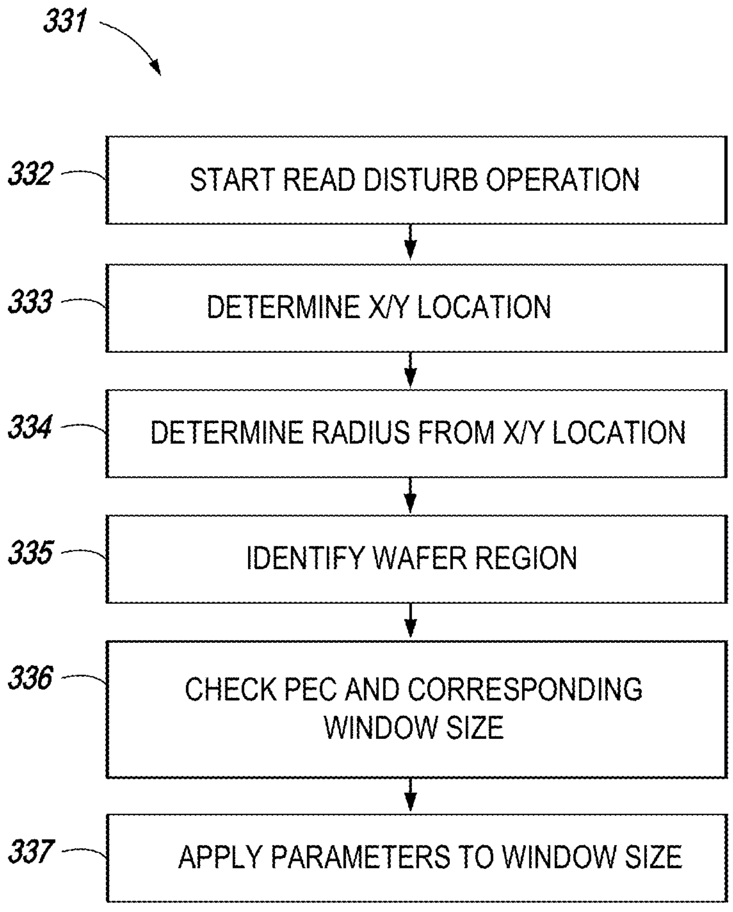
FIG. 3 illustrates an example diagram of performing read disturb management in accordance with some embodiments of the present disclosure.

FIG. 3 is a flow diagram of an example method 331 corresponding to read disturb management in accordance with some embodiments of the present disclosure. The method 331 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 331 is performed by the read disturb component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 332, the processing device (e.g., processing device 112) initiates the read disturb operation. The read disturb operation is initiated to correct errors that occur where a read to one row of memory cells impacts the threshold voltages of unread memory cells in different rows of memory in the same block.

At block 333, the processing device can determine an X/Y location of a memory die on a memory wafer. For example, the X/Y location is a measure of a distance from the center of the wafer at which a memory die is fabricated in the X and/or Y direction (as labeled). The location of the memory die can be based on a location identification within system data that indicates where each memory die was located at time of manufacturing. For example, a fuse_ID (FID) can be used to determine a location of a memory die within a memory wafer.

At block 334, the processing device can determine a radius from the X/Y location. The determined radius can provide a way to compare different regions of the wafer. For example, the regions A through D in FIG. 2 can be identified based on the radius or distance from the center of the wafer, as is described above in association with FIG. 2. At block 335, the processing device can identify the wafer region that the memory die is in using the determined radius. The plurality of memory dies in the memory wafer can each be identified as within a particular region and in this way the memory dies can be apportioned to each corresponding region for subsequent determinations more efficiently.

At block 336, the processing device can check a program/erase count (PEC) and corresponding window size. As an example, the PEC can indicate a particular window size based on how many times the memory cells of the memory die have been accessed. The greater the number of program and erase cycles, the more likely the memory cells may malfunction and the greater need to check the memory cells for errors. Therefore, a higher PEC can correspond to a smaller window size and scanning at a greater frequency in order to identify errors more quickly and frequently. A lower PEC can correspond to a greater window size and scanning at a lower frequency in order to preserve resources and not scan too frequently if the memory cells are still most likely operating correctly.

At block 337, the processing device can apply parameters to determine a final window size. As an example, the parameters can include a previous window size based on the PEC and a location on the wafer of the associated memory die. In this way, the PEC and the memory die location can affect the window size, resulting in a better approach to preserve memory resources while avoiding errors in the data. Table 1 illustrates an example of this determination, where r is a radius of the memory die, W_PEC is a window size that corresponds to the memory die's PEC, and B corresponds to a variable between 0 and 1 that adjusts the former window size (that corresponds to the PEC) by a particular amount based on the radius.

TABLE 1

| RADIUS | REGION | WINDOW SIZE |
|---|---|---|
| $0 \leq r \leq R1$ | A | W_PEC |
| $R1 \leq r \leq R2$ | B | W_PEC * β1 |
| $R2 \leq r \leq R3$ | C | W_PEC * β2 |
| $R3 \leq r \leq R4$ | D | W_PEC * β3 |
| $R4 \leq r \leq R5$ | E | W_PEC * β4 |

As an example, a memory die whose radius is between 0 and R1 would be identified as in region A and would not be adjusted. A memory die whose radius is between R1 and R2 would be identified as within region β and the former window size would be adjusted by β1, and so forth. The order of value for β would be β1>β2>β3>β4>β5 as the memory dies in region E would be adjusted to the smallest window size. However, as an example, a memory die with a low PEC and a larger radius may have a more similar window size to a memory die with a high PEC and a smaller radius. That is to say, both the location from the center of the wafer and the PEC value can affect how large or small is the final window size.

Figure 4:
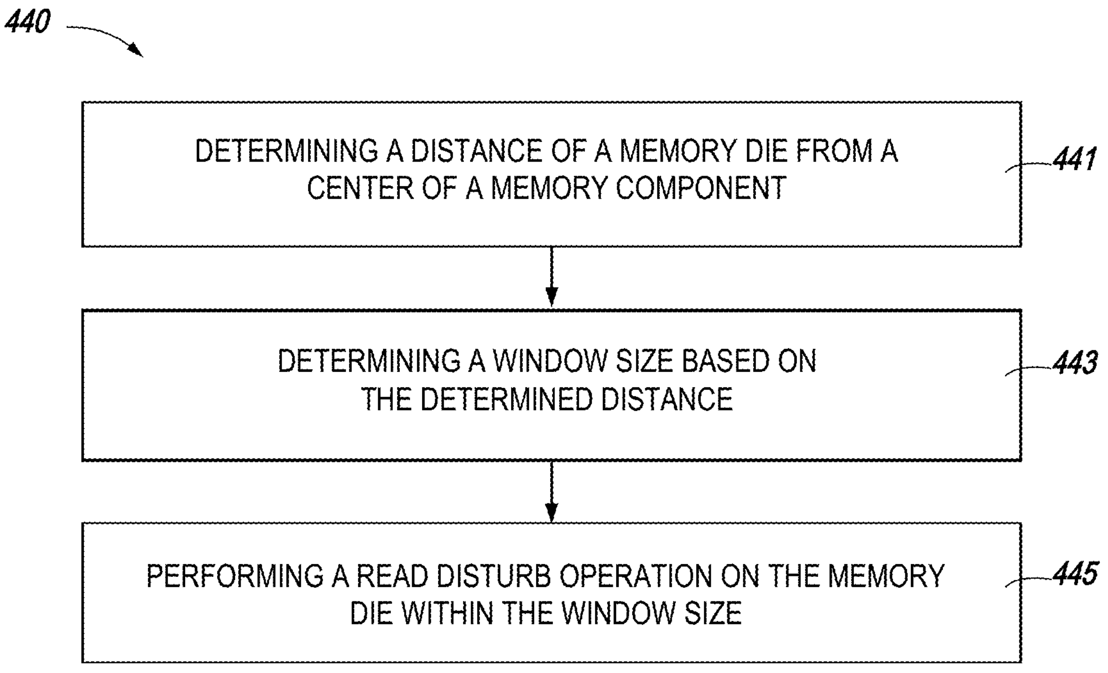
FIG. 4 is a flow diagram of an example method corresponding to read disturb management in accordance with some embodiments of the present disclosure.

FIG. 4 is a flow diagram of an example method 440 corresponding to read disturb management in accordance with some embodiments of the present disclosure. The method 440 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 440 is performed by the read disturb component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 441, the processing device (e.g., processing device 112) can determine a distance of a memory die from a center of a memory component. In some examples, the memory component refers to a memory wafer. The distance can be determined based on a fuse_ID (FID) that indicates the location of the memory die in the wafer and the distance can be extrapolated from that location. At block 443, the processing device can determine a window size based on the determined distance. In some examples, the window size can be decreased in response to a distance of the memory die from the center of the memory component being a greater distance. In some examples, the window size is increased in response to the distance of the memory die from the center of the memory component being a lesser distance.

At block 445, the processing device can perform a read disturb operation on the memory die within the window size. In some examples, performing the read disturb operation can include selecting a random read operation of the memory die within the window size. The random read operation can be selected in order to perform an error check on the data stored in the memory die during that selected read operation. In some examples, performing the read disturb operation can include checking a raw bit error rate (RBER) of victim word lines associated with the random read operation of the memory die. In some examples, in response to the RBER being greater than a threshold RBER, a refresh can be performed on a block of memory where the random read operation was performed. In some examples, in response to the RBER being less than a threshold RBER, a refresh operation may not be performed on a block of memory where the random read operation was performed.

Figure 5:
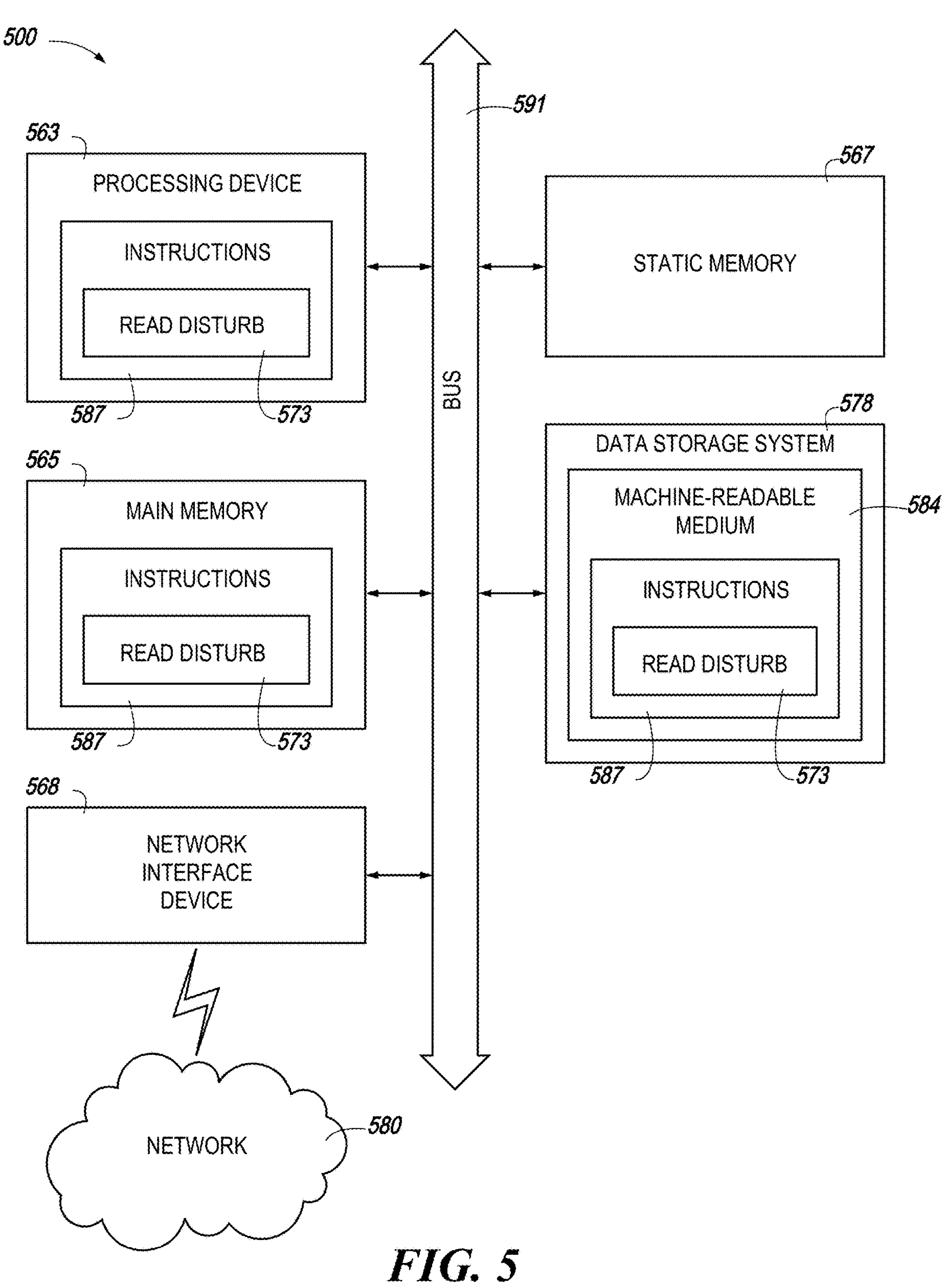
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 102 of FIG. 1) that includes, is coupled to, or utilizes a memory sub-system (e.g., the memory sub-system 104 of FIG. 1) or can be used to perform the operations of a controller (e.g., to adjust a parameter associated with programming a memory cell, such as a window adjustment component 113). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 563, a main memory 565 (e.g., read-only memory (ROM), flash memory, dynamic random access memory (DRAM) such as synchronous DRAM (SDRAM) or Rambus DRAM (RDRAM), etc.), a static memory 567 (e.g., flash memory, static random access memory (SRAM), etc.), and a data storage system 578, which communicate with each other via a bus 591.

Processing device 563 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 563 can also be one or more special-purpose processing devices such as an application specific integrated circuit (ASIC), a field programmable gate array (FPGA), a digital signal processor (DSP), network processor, or the like. The processing device 563 is configured to execute instructions 587 for performing the adjustment operations using a window adjustment component 573 (including adjusting a voltage window previously described) and steps discussed herein. The computer system 500 can further include a network interface device 568 to communicate over the network 580.

The data storage system 578 can include a machine-readable storage medium 584 (also known as a computer-readable medium) on which is stored one or more sets of instructions 587 or software embodying any one or more of the methodologies or functions described herein. The instructions 587 can also reside, completely or at least partially, within the main memory 565 and/or within the processing device 563 during execution thereof by the computer system 500, the main memory 565 and the processing device 563 also constituting machine-readable storage media. The machine-readable storage medium 584, data storage system 578, and/or main memory 565 can correspond to the memory sub-system 104 of FIG. 1.

In one embodiment, the instructions 587 include instructions to implement functionality corresponding to adjustment of a voltage window (e.g., window adjustment component 113 of FIG. 1). While the machine-readable storage medium 584 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:

a memory device including a group of memory cells; and a processing device coupled to the memory device and configured to:

determine a distance of a memory die from a center of a memory component on which the memory die was manufactured; and perform a read disturb operation on the memory die based on the determined distance.

2. The apparatus of claim 1, wherein the memory component is a memory wafer.

3. The apparatus of claim 1, wherein the processing device is configured to perform the read disturb operation by determining a window size.

4. The apparatus of claim 3, wherein the processing device is configured to determine a smaller window size in response to determining a greater distance.

5. The apparatus of claim 3, wherein the processing device is configured to determine a larger window size in response to determining a smaller distance.

6. The apparatus of claim 1, wherein the processing device is configured to perform the read disturb operation by determining a scan frequency.

7. The apparatus of claim 6, wherein the processing device is configured to determine a lower scan frequency in response to a smaller distance.

8. The apparatus of claim 6, wherein the processing device is configured to determine a higher scan frequency in response to a larger distance.

9. A method, comprising:

determining a distance of a memory die from a center of a memory wafer on which the memory die was manufactured;

determining a window size based on the determined distance; and performing a read disturb operation on the memory die within the window size.

10. The method of claim 9, wherein the window size is decreased in response to the distance of the memory die from the center of the memory wafer being a greater distance.

11. The method of claim 9, wherein the window size is increased in response to the distance of the memory die from the center of the memory wafer being a lesser distance.

12. The method of claim 9, wherein performing the read disturb operation comprises selecting a random read operation of the memory die within the window size.

13. The method of claim 12, wherein performing the read disturb operation comprises checking a raw bit error rate (RBER) of victim word lines associated with the random read operation of the memory die.

14. The method of claim 13, wherein, in response to the RBER being greater than a threshold RBER, performing a refresh on a block of memory where the random read operation was performed.

15. The method of claim 13, wherein, in response to the RBER being less than a threshold RBER, not performing a refresh operation on a block of memory where the random read operation was performed.

16. A system, comprising:

a memory device including a group of memory dies each comprising a group of memory cells; and a processing device coupled to the memory device and configured to:

for each memory die of the group of memory dies, determine a respective distance from a center of a wafer on which the memory die was manufactured;

determine a respective window size for each memory die of the group of memory dies based on the determined respective distances, wherein a greater distance from the center is associated with a smaller window size; and perform a read disturb operation on at least one memory die of the group of memory dies within the respective window size.

17. The system of claim 16, wherein the processing device is configured to determine a scan frequency based on the determined respective distances.

18. The system of claim 17, wherein the scan frequency is decreased in response to the determined distance being smaller.

19. The system of claim 17, wherein the scan frequency is increased in response to the determined distance being greater.

20. The system of claim 16, wherein the processing device is further configured to determine the respective window size for each memory die of the group of memory dies based on respective program/erase counts (PECs) for the group of memory dies.

* * * * *